(12) United States Patent
Harper, Jr. et al.

(10) Patent No.: US 6,712,626 B2
(45) Date of Patent: *Mar. 30, 2004

(54) ELECTRICAL CONNECTOR WITH CONTINUOUS STRIP CONTACTS

(75) Inventors: Donald K. Harper, Jr., Harrisburg, PA (US); Lewis R. Johnson, Liverpool, PA (US)

(73) Assignee: Berg Technology, Inc., Reno, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/376,098

(22) Filed: Feb. 28, 2003

(65) Prior Publication Data

US 2003/0129874 A1 Jul. 10, 2003

Related U.S. Application Data

(63) Continuation of application No. 09/417,725, filed on Oct. 14, 1999, now Pat. No. 6,595,788.

(51) Int. Cl.$^7$ ................................................. H01R 9/09
(52) U.S. Cl. .......................................... 439/83; 439/590
(58) Field of Search ............................ 439/83, 78, 590, 439/937, 247, 248, 74, 874, 736

(56) References Cited

U.S. PATENT DOCUMENTS

| | | | |
|---|---|---|---|
| 3,500,295 A | 3/1970 | Faber et al. | 339/17 |
| 4,054,354 A | 10/1977 | Unger | 439/205 |
| 4,391,482 A | 7/1983 | Czeschka | 339/59 |
| 4,602,830 A | 7/1986 | Lockard | |
| 4,641,426 A | 2/1987 | Hartman et al. | 29/839 |
| 4,655,517 A | 4/1987 | Bryce | |
| 4,678,250 A | 7/1987 | Romine et al. | 439/83 |
| 4,915,286 A | 4/1990 | Mentzer et al. | 228/173.5 |
| 5,580,283 A | 12/1996 | O'Sullivan et al. | 439/686 |
| 5,830,012 A | 11/1998 | Ortega et al. | 439/590 |
| 5,969,952 A | * 10/1999 | Hayashi et al. | 361/744 |
| 6,042,389 A | * 3/2000 | Lemke et al. | 439/74 |
| 6,042,423 A | 3/2000 | Murr et al. | 439/590 |
| 6,095,842 A | 8/2000 | Lin | 439/342 |
| 6,146,199 A | 11/2000 | Ortega et al. | 439/590 |
| 6,325,644 B1 | * 12/2001 | Lemke et al. | 439/83 |

FOREIGN PATENT DOCUMENTS

| | | |
|---|---|---|
| EP | 0 362 841 A2 | 4/1990 |
| EP | 0 836 243 A2 | 4/1998 |
| EP | 0 847 112 A1 | 6/1998 |
| WO | WO-98/15989 | 4/1998 |

OTHER PUBLICATIONS

Berg Electronics—Product Data Sheet (3pg) #67996–408H BergStik® II Headers.
Berg Electronics—Product Data Sheet (3pg) #71276–504HT BergStik® II Surface Mount Headers.

* cited by examiner

Primary Examiner—P. Austin Bradley
Assistant Examiner—Phuongchi Nguyen
(74) Attorney, Agent, or Firm—Harrington & Smith, LLP

(57) ABSTRACT

An electrical connector contact strip including spaced electrical contacts, a body and fusible elements. The spaced electrical contacts each have a main section and a tab section extending from an end of the main section. The body includes dielectric material molded onto the contacts and connecting the contacts to each other. The fusible elements are mounted on the tab sections.

20 Claims, 5 Drawing Sheets

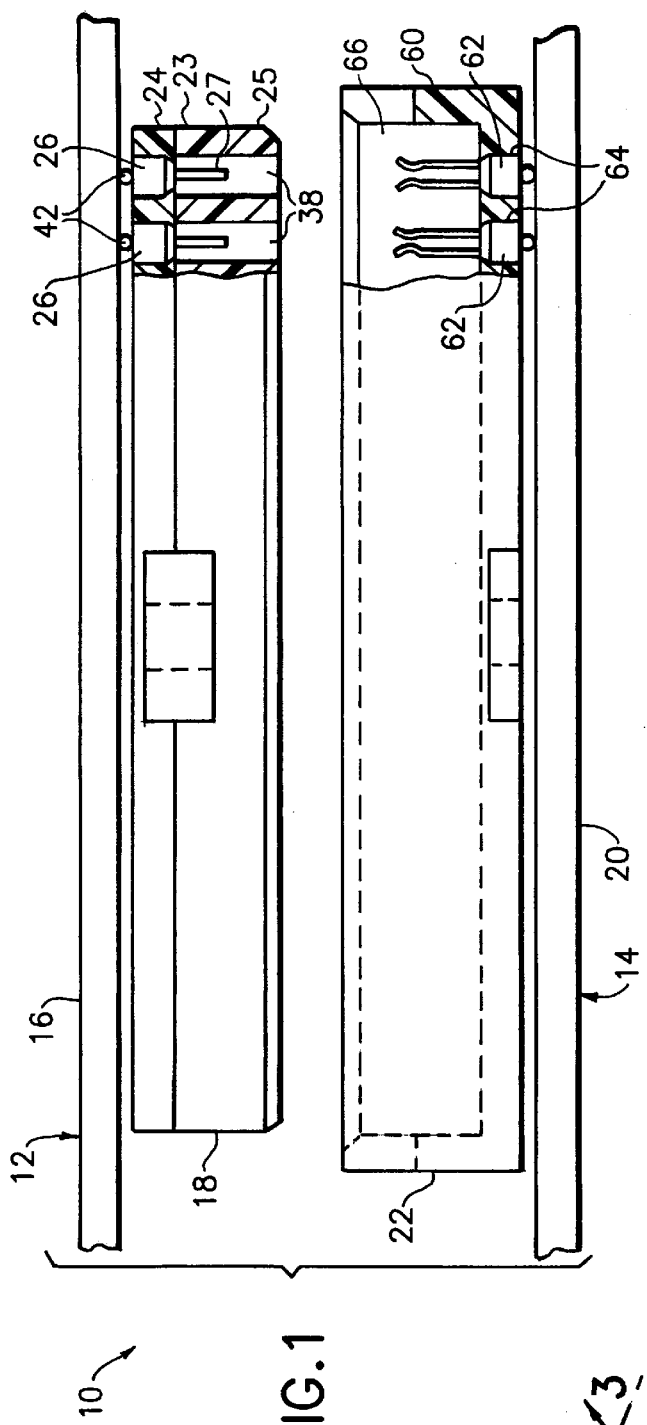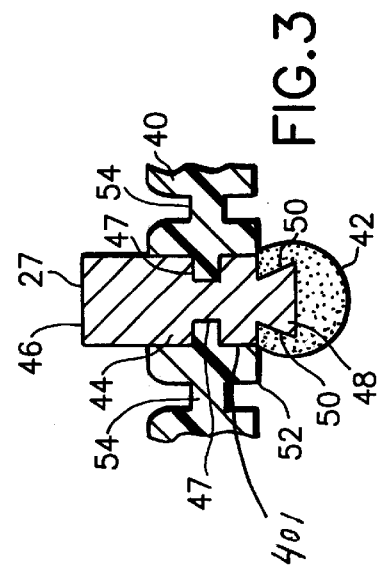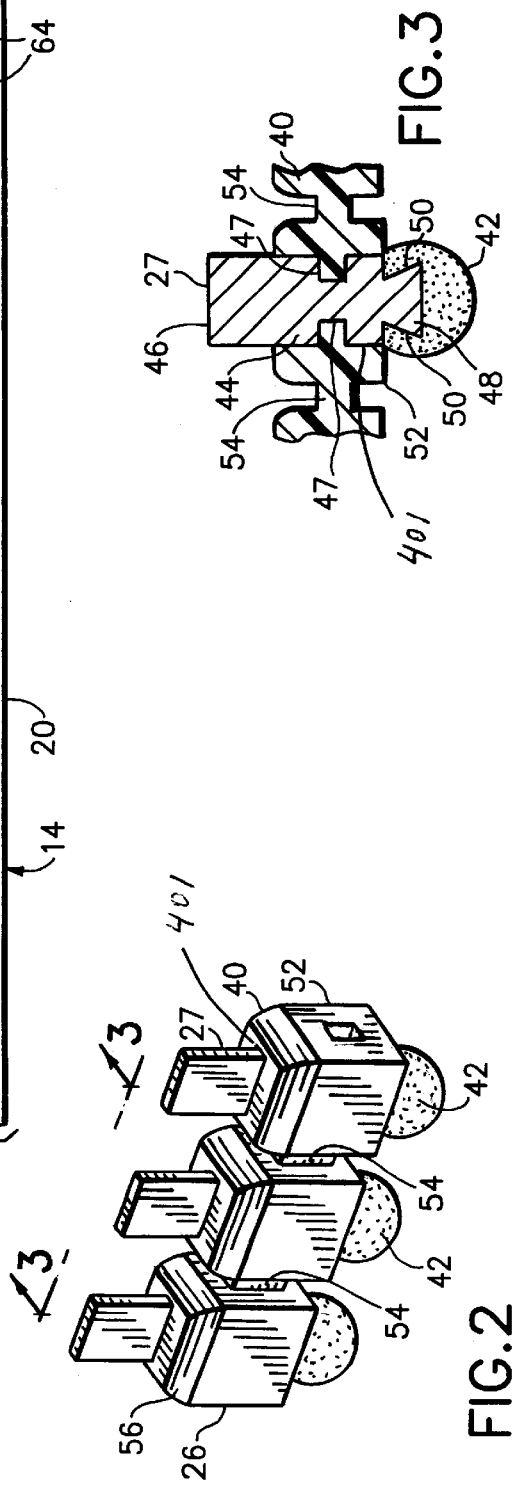

ELECTRICAL CONNECTOR WITH CONTINUOUS STRIP CONTACTS

CROSS REFERENCE TO RELATED APPLICATION

This patent application is a continuation application of U.S. patent application Ser. No. 09/417,725, filed Oct. 14, 1999, now U.S. Pat. No. 6,595,788.

BACKGROUND OF THE INVENTION

1. Field of the Invention

The present invention relates to electrical connectors and, more particularly, to a continuous strip of contacts secured in a housing to form an electrical connector.

2. Brief Description of Earlier Developments

U.S. Pat. No. 3,500,295 discloses an electrical connector with terminals connected by an injection-molded elongate body which is embedded in a supporting structure. PCT publication No. WO 98/15989, herein incorporated by reference, discloses a high density electrical connector with contacts having solder balls. A deformable element in an opening in the housing frictionally retains the contact.

A problem exists with conventional connectors in that solder can move by wicking into a contact area of a contact, when the solder is melted, which can interfere with a connection at the contact area. Another problem exists with conventional connectors in that different sizes of connectors having different row lengths and array sizes require different tooling to manufacture. Another problem exists with conventional connectors in that effects of differential coefficient of thermal expansion in a direction transverse to trip direction can cause damage to soldered connections. Another problem exists with conventional connectors in that tensile failures can occur in the connection of a solder ball to a contact. The present invention can help to overcome these problems and provide other advantages.

SUMMARY OF THE INVENTION

In accordance with one embodiment of the present invention, an electrical connector contact strip is provided comprising spaced electrical contacts, a body and fusible elements. The spaced electrical contacts each have a main section and a tab section extending from an end of the main section. The body comprises dielectric material molded onto the contacts and connecting the contacts to each other. The fusible elements are mounted on the tab sections.

In accordance with another embodiment of the present invention an electrical connector is provided comprising a housing; and at least two rows of electrical connector contact strips connected to the housing. Each contact strip has electrical contacts connected to each other by a body comprising dielectric material. The contact strips are movably captured by their bodies in the housing.

In accordance with another embodiment of the present invention, an electronic component assembly is provided comprising a first electronic component comprising a printed circuit board; and an electrical connector connected to the printed circuit board. The electrical connector comprises a housing and a plurality of contact strips connected to the housing. The contact strips each comprising electrical contacts connected to each other by a body. The bodies are movably captured in the housing such that the bodies can move relative to each other.

In accordance with one method of the present invention, a method of assembling an electrical connector is provided comprising steps of forming electrical contact strips, each strip comprising electrical contacts connected to each other by a dielectric body; and mounting the strips by their bodies to a housing, wherein the bodies are movably captured by the housing.

BRIEF DESCRIPTION OF THE DRAWINGS

The foregoing aspects and other features of the present invention are explained in the following description, taken in connection with the accompanying drawings, wherein:

FIG. 1 is an exploded partial cross-sectional elevational view of an electronic assembly incorporating features of the present invention;

FIG. 2 is a partial perspective view of one of the contact strips used in one of the electrical connectors shown in FIG. 1;

FIG. 3 is a cross-sectional view of the contact strip shown in FIG. 2 taken along line 3—3;

DETAILED DESCRIPTION OF THE PREFERRED EMBODIMENT

Figure 4:
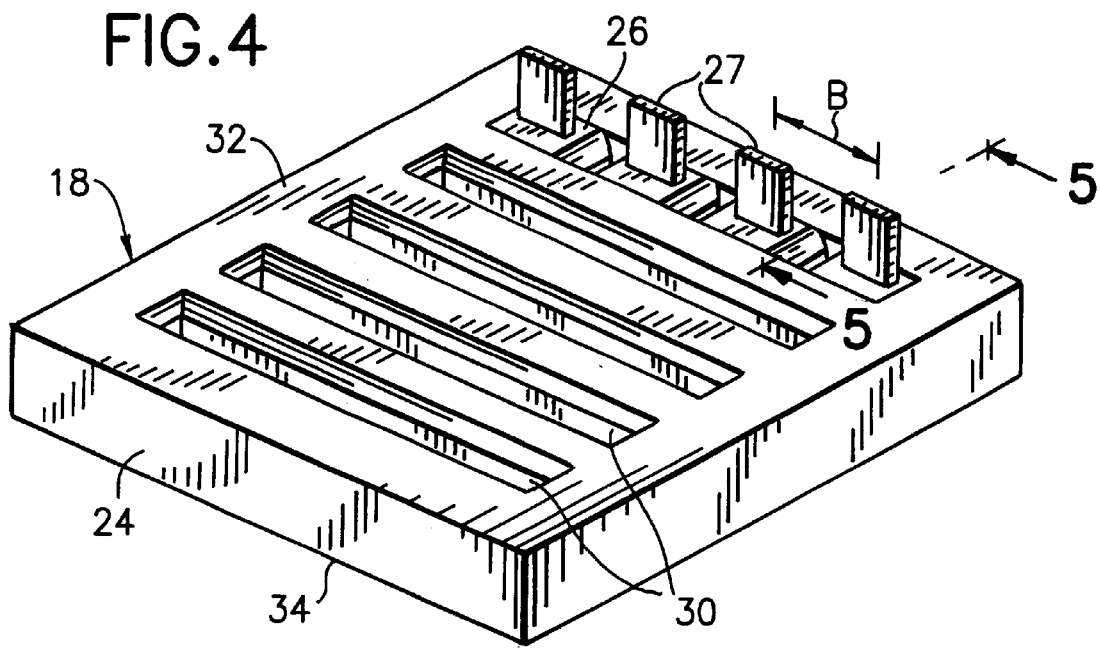
FIG. 4 is a perspective view of one of the connectors shown in FIG. 4.

Referring to FIG. 1, there is shown an exploded elevational view of an assembly 10 incorporating features of the present invention. Although the present invention will be described with reference to the embodiments shown in the drawings, it should be understood that the present invention can be embodied in many alternate forms of embodiments. In addition, any suitable size, shape or type of elements or materials could be used.

Figure 5:
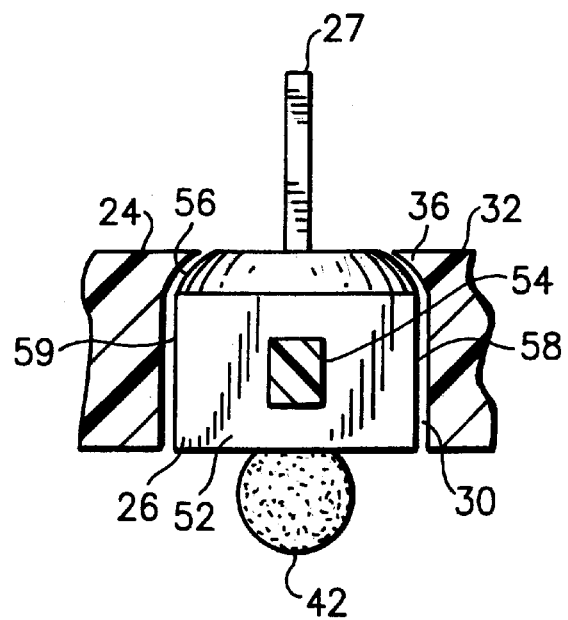
FIG. 5 is a partial cross-sectional view taken along line 5—5 in FIG. 4.

The assembly 10 generally comprises a first electronic component assembly 12 and a mating second electronic component assembly 14. In this embodiment the first assembly 12 generally comprises a first circuit substrate, such as a printed circuit board 16 and a first electrical connector 18. The second assembly 14 generally comprises a second circuit substrate, such as a printed circuit board 20 and a second electrical connector 22. However, in alternate embodiments the connectors 18, 22 could be attached to different types of electronic components other than printed circuit boards. Referring also to FIGS. 2–4, the first connector 18 generally comprises a housing 23 and strips of contacts 26. Each strip defines a row of contacts. The housing 23 is preferably comprised of molded plastic or polymer dielectric material, such as a liquid crystal polymer (LCP). In this embodiment the housing 23 is comprised of two housing pieces 24, 25. However, in alternate embodiments the housing 23 could be comprised of only one or more than two pieces. In another alternate embodiment, the housing piece 24 may include features, such as solder pads or standoffs (not shown), that help in mounting the housing to the first printed circuit board 16. However, any suitable means can be provided for attaching the housing to the first printed circuit board. In this embodiment the housing piece 24 has receiving areas 30 for receiving the contact strips 26. FIG. 4 shows only one contact strip 26 in the receiving areas 30 merely for the sake of clarity. In actual practice all the receiving areas 30 would preferably have contact strips 26 located therein. In the embodiment shown, the housing piece 24 has five receiving areas 30 aligned parallel to each other as straight slots which extend entirely through the housing piece 24 between the two sides 32, 34. However, in alternate embodiment any suitable number of receiving areas 30 could be provided. In this embodiment the receiving areas 30 can each hold a contact strip 26 of four of the contacts 27. However, in alternate embodiments each receiving area 30 can hold any suitable number of contacts 27. As seen best in FIG. 5, each receiving area 30 could have opposing inwardly projecting ledge 36 proximate the side 32. The second housing piece 25 is attached to the first housing piece 24 and has areas 38 with the contacts 27 therein for receiving portions of the contacts in the second electrical connector 22. However, in alternate embodiments any suitable type of housing can be provided.

The contact strips 26 are adapted to be inserted into the housing 23 in a modular assembly fashion. The strips 26 can each comprise a body 40, the contacts 27, and formed bodies, such as solder balls 42. The body 40 is preferably a one-piece molded plastic or polymer member which is preferably over-molded onto the contacts 27. However, in an alternate embodiment the body 40 could comprise multiple members and/or the body 40 could be formed separate from the contacts 27 with the contacts 27 being subsequently inserted into the body 40. Over-molding the body 40 onto the contacts causes the body 40 to function as a seal 401 between the two opposite sections 46, 48 of the contacts 27 to prevent solder from the solder ball 42 wicking up the contact 27 during a reflow operation used to secure the connector 18 to the printed circuit board 16. Thus, a suitable amount of solder is available to surface mount connector 18 and the contact surface of the male contact section 46 is prevented from being contaminated by solder. Alternatively, contacts 27 could have any suitable type of connection at the two end sections 46, 48. For example, the contacts 27 could have surface mount tails.

In a preferred method of manufacturing the strips 26, the contacts 27 are connected to each other as a unitary contact blank. The body 40 is over-molded onto the contact blank. Then the contact blank is cut to remove connecting sections to thereby electrically isolate the individual electrical contacts 27 from each other. However, the body 40 maintains a structural connection among the contacts 27 in the strip 26. Preferably, the strips 26 are manufactured as a substantially continuous strip which is rolled onto a reel and subsequently cut into predetermined lengths of the contacts 27 for assembly into housings. In an alternate method of manufacturing the contact strip the body could be preformed and the contacts could be inserted into the preformed body.

Each contact 27 is preferably stamped and formed from a sheet of conductive material, such as copper alloy. Each contact has a center section 44 and two end sections 46, 48. A first one of the end sections 46 extends from the body 40 and forms a contact area, such as the blade-type contact area shown in FIG. 2, or the dual beam contact shown in FIG. 6, or any other suitable arrangement. The second end section 48 extends from the opposite end of the body 40 and could have a solder ball mounting tab for mounting the solder ball 42 to the contact 27. When using a solder ball, the tab 48 can have a dovetail shape with two pockets 50 between the tab 48 and the center section 44. The material of the solder ball 42 extends into the pockets 50 to retain the solder ball 42 on the contact 27 prior to mounting of the connector 18 to the first printed circuit board 16. However, other shapes of the contacts 27 and other features could be provided.

The body 40 generally comprises main sections 52 and interconnecting sections 54. The main sections 52 surround individual ones of the center sections 44 of the contacts 27. The contacts 27 include notches 47 in the center section 44. When the body 40 is molded onto the center section 44 the material of the body 40 extends into the notches 47. This forms an interlocking of the contacts 27 to the body 40 to retain the contacts with the body. However, any suitable system for connecting the contacts with the body could be provided. The interconnecting sections 54 connect the main sections 52 of each strip 26 to each other in series. In one embodiment, the main sections 52 comprise tapered top edges 56. The main sections 52 are sized and shaped to very closely fit inside the receiving areas 30. Alternatively, strip 26 could be interference fit within receiving areas 30. The top edges 56 interact with the ledges 36 to retain the body 40 with the housing piece 24 prior to mounting the first connector 18 to the first printed circuit board 16. The interconnection sections 54 are smaller than the main sections 52 and are adapted to both space the main sections 52, and their respective contacts 27, from each other in each strip 26 at fixed locations and, allow for relatively easy cutting or severing of the interconnection sections 54 to form the multiple strips 26 from a reel of a relatively long single contact strip. In alternate embodiments the main sections 52 and interconnection sections 54 could have any suitable shape. Alternative and/or additional means could also be used to assemble the contact strips 26 with the housing piece 24.

Figure 6:
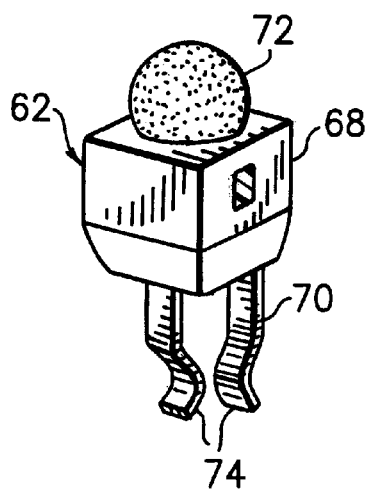
FIG. 6 is a partial perspective view of the other one of the contact strips shown in the second connector shown in FIG. 1.

Referring now to FIGS. 1 and 6, the second electrical connector 22 generally comprises a second housing 60 and electrical connector contact strips 62. The second housing 60 has slots 64 therethrough which function as receiving areas for the contact strips 62 similar to the receiving areas 30 in the first housing piece 24. The second housing 60 is adapted to be fixedly connected to the second circuit substrate, such as a printed circuit board 20. The second housing 60 has a perimeter wall that defines a receiving area 66 for aligning and receiving a portion of the first connector 18 therein. The contact strips 62 each generally comprise a frame 68, electrical contacts 70 and formed bodies, such as solder balls 72. The frame 68 is substantially the same as the frame 52. The solder balls 72 are substantially the same as the solder balls 42. The electrical contacts 70 generally comprise two deflectable arms 74 which form mating area for receiving the first end section 46 of the first contacts 27. The arms 74 are sized and shaped to fit inside the areas 38 of the first connector's housing 25, if used. The contact strips 62 and housing 60 are connected to each other similar to the contact strips 26 and housing piece 24.

This design concept over molds a continuous strip of contacts that have a solder ball soldering attachment on one end and a mating configuration on the other. The strip is produced on a matching pitch B. The strips are cut to any desired length to construct a series of rows to form an array that is positioned by another member that would hold them in position to form this configuration. This design eliminates solder wicking into the contact area by the over molded section separating the two areas. This design provides flexibility for configuring various row lengths and array sizes. For example, the same type contact strip can be used with different size housings merely by cutting the contact strip to different lengths such as for housings for holding strips of 8, 10, 20, 30, or 40 contacts each. This design reduces the tooling cost for producing multiple sizes by utilizing one component to produce many variations of sizes. This design is highly automatable in the form of a continuous strip for significant cost savings. This design de-couples the effects of differential co-efficient of thermal expansion (CTE) in the direction transverse to strip direction by utilizing rows of terminals to construct an array configuration making the construction of large arrays feasible. The larger the size of the connector, the larger the differential CTE. By decoupling the contacts 27, 70 in direction A, with the contacts being able to partial move or float relative to their frames, the differential CTE among the various components can be accommodated to prevent damage to the soldered connections to the printed circuit boards. This design can incorporate a ball tab feature that resist solder ball tensile failures.

Figure 7:
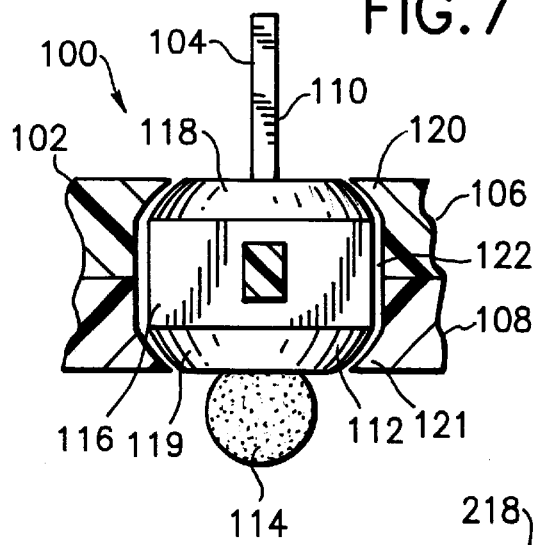
FIG. 7 is a partial cross-sectional view of an alternate embodiment of the first electrical connector.

Referring now to FIG. 7 a partial cross-sectional view of an alternate embodiment of the connector is shown. In this embodiment the connector 100 includes a housing 102 and contact strips 104 (only one of which is shown) captured by the housing 102. The housing 102 generally comprises two housing pieces 106, 108. The contact strips 104 generally comprise contacts 110, body 112, and formed bodies, such as solder balls 114. The contacts 110 and solder balls 114 are substantially the same as the contacts 27 and solder balls 42. The main sections 116 of the body 112 are substantially the same as the main sections 52, but have tapered top and bottom edges 118, 119. The housing pieces 106, 108 have inwardly projecting ledges 120, 121 at lateral sides of the receiving slots 122 to capture the body 112 in the slots. The spacing between the lateral sides of the body 112 and the housing pieces at the slots 122 is such that the body 112 and their contacts 110 can slightly laterally move as indicated by arrow A.

Figure 8:
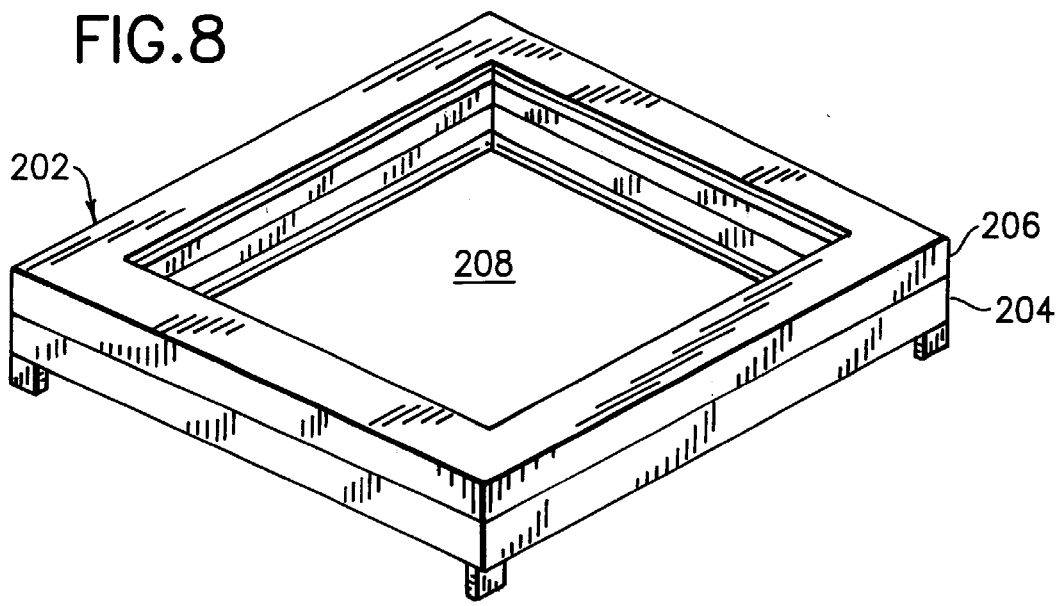
FIG. 8 is a perspective view of the housing of another alternate embodiment of the electrical connector.
Figure 9:
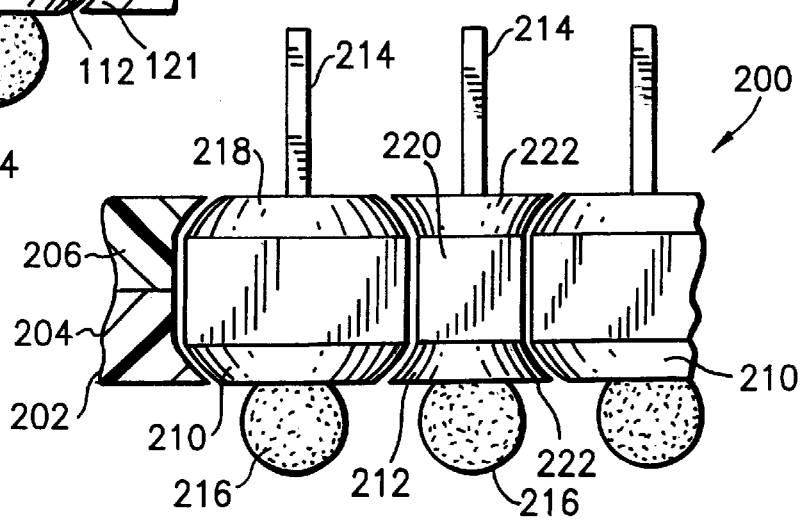
FIG. 9 is a partial cross-sectional view of an alternate embodiment of the electrical connector using the housing shown in FIG. 8.

Referring now to FIGS. 8 and 9 another alternate embodiment will be described. In this embodiment the connector 200 has a housing 202 with two pieces 204, 206 that have an enlarged receiving area 208 sized and shaped to receive more than one contact strip. In this embodiment the connector 200 has two different types of contact strips 210, 212. The contact strips 210, 212 have the same type of contacts 214 and solder balls 216, but their frames or bodies 218, 220 have different shapes. More specifically, the main sections of the bodies 218, 220 are sized and shaped to mate with each other as shown. The bodies 218 are substantially the same as the bodies 112, but the bodies 220 have outwardly projecting ledges 222 on its top and bottom sides such that the bodies 218, 220 cooperate to capture each other within the receiving area 208. In an alternate embodiment each contact strip could have alternating types of the bodies 218, 220.

Figure 10A:
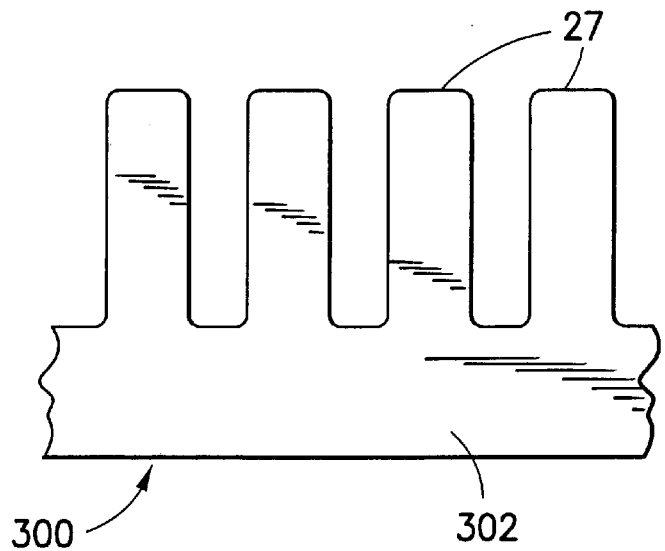
FIG. 10A is a partial front elevational view of contacts attached to a carry strip.
Figure 10B:
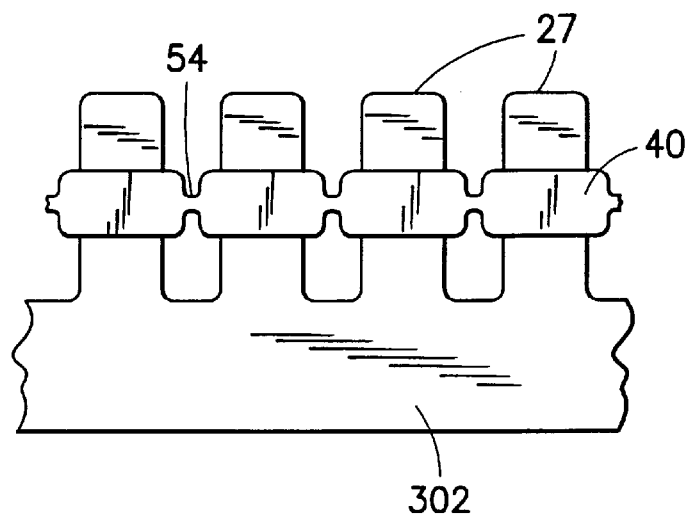
FIG. 10B is a partial front elevational view of the contacts shown in FIG. 10A with the body of a contact strip formed onto the contacts.
Figure 10C:
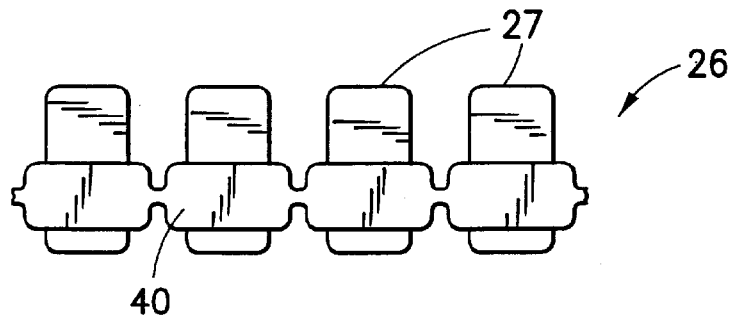
FIG. 10C is a partial front elevational view as in FIG. 10B with the carry strip removed.

Referring now to FIGS. 10A, 10B and 10C, one method of manufacturing a contact strip will be described. In this method, as seen in FIG. 10A, the contacts 27 are formed from a sheet 300 of conductive material. The sheet 300 has been stamped and formed to provide a carry strip 302 that connects the contacts 27 to each other. The body, including interconnection sections 54, is then over-molded onto the contacts 47 as shown in FIG. 10B. As seen in FIG. 10C, the carry strip 302 is then removed from the contacts 27. The contacts 27 are, thus, spaced from each other and electrically isolated from each other. The body 40 maintains the structural relationship of the contacts 27 relative to each other after the carry strip 302 is removed.

Figure 11:
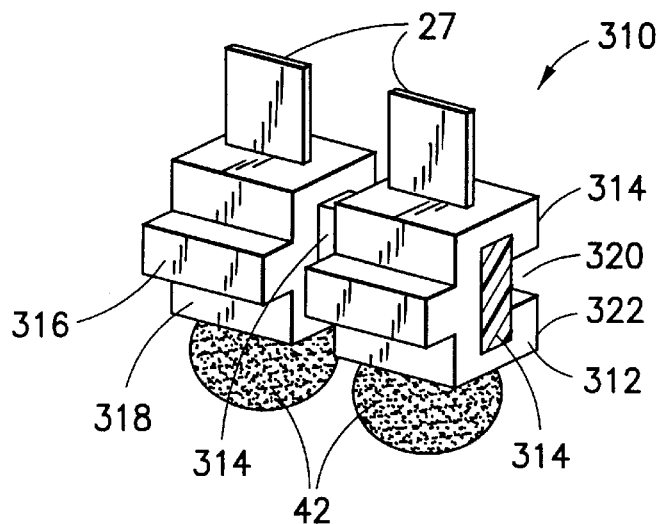
FIG. 11 is a partial perspective view of an alternate embodiment of the contact strip.
Figure 12A:
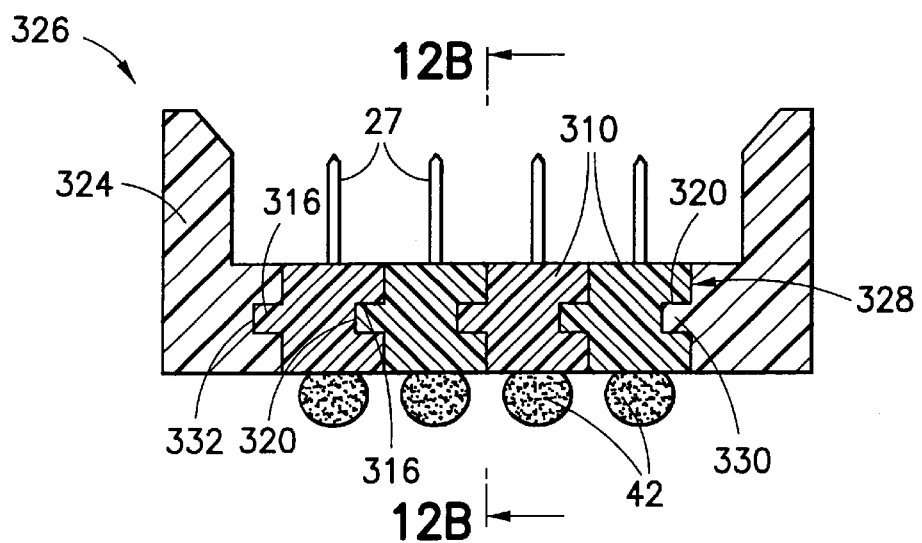
FIG. 12A is a cross-sectional view of an alternate embodiment of the electrical connector having contact strips as shown in FIG. 11.
Figure 12B:
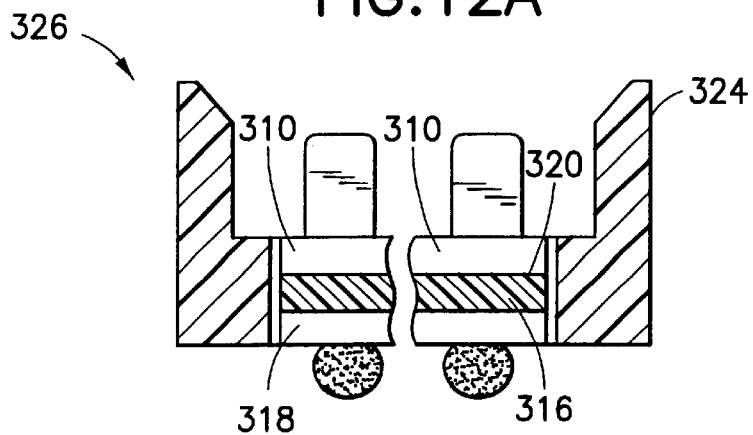
FIG. 12B is a cross-sectional view of the connector shown in FIG. 12A taken along line 12B—12B.

Referring now to FIG. 11, an alternate embodiment of the contact strip 26 is shown. In this embodiment the contact strip 310 generally comprises contacts 27, a body 314, and fusible elements 42, such as solder balls. The body 314 generally comprises main sections 312 and interconnecting sections 314. The main sections 312 include a lateral projection 316 on one side 318 and a lateral recess 320 on an opposite side 322. Referring also to FIGS. 12A and 12B, a plurality of the contact strips 310 are shown connected to each other and with a housing 324 to form a connector 326. The lateral projections 316 and recesses 320 are sized and shaped to mate with each other to connect the strips 310 to each other. In alternate embodiments any suitable shape of mating connection between the strips could be provided. In this embodiment the housing 324 includes a receiving area 328 to receive the strips 310. The housing 324 includes a projection 330 at one side of the receiving area 328 and a recess 332 at an opposite side of the receiving area. The projection 330 extends into the recesses 320 of one of the strips 310. The recess 332 receives the projections 316 of another one of the strips 310. Thus, the interlocking of the projections 316, 330 with the recesses 320, 332 connect the strips 310 with each other and the housing 324. With this type of embodiment the strips 310 are not substantially constrained in the plane shown in FIG. 12B.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An electrical connector contact strip comprising:
   a plurality of electrical contacts fixedly connected to each other in a row, each contact having a main section and a tab section extending from an end of the main section; and
   fusible elements mounted on the tab sections such that the fusible elements are aligned in a row, wherein the electrical contacts are adapted to be subsequently inserted into an the electrical connector housing with the fusible elements attached to and, after the contacts are inserted into an the electrical connector housing, the fusible elements are are at least partially located outside of the electrical connector housing aligned in a row,
   wherein the fusible elements have portions located in pocket area of the contacts to retain the fusible elements on the tab section.

2. An electrical connector contact strip comprising:
   a plurality of electrical contacts fixedly connected to each other in a row, each contact having a main section and a tab section extending from an end of the main section; and
   fusible elements mounted on the tab sections such that the fusible elements are aligned in a row, wherein the electrical contacts are adapted to be subsequently inserted into an electrical connector housing with the fusible elements attached and, after the contacts are inserted into the electrical connector housing, the fusible elements are at least partially located outside of the electrical connector housing aligned in a row,
   wherein the tab section comprise pocket areas and wherein the fusible element have portions located in the pocket areas of the contacts to retain the fusible elements on the tab sections.

3. A method of assembling an electrical connector contact strip comprising steps of:
   providing a plurality of electrical contacts connected in series, each contact comprising a first end, a second end and a middle section therebetween, wherein the contacts are comprised of stamped sheet metal; and attaching solder balls to the second ends of the contacts, the second ends of the contacts extending into the solder balls to thereby attach the solder balls with the second ends, wherein the contacts and solder balls are provided as a series of connected, stamped sheet metal, fusible element mountable electrical contacts in a strip which is adapted to be subsequently connected to a housing to form an electrical connector, wherein the step of providing the contacts connected in series comprises overmolding a body onto the middle sections of the contacts to connect the contacts to each other, the body forming a seal on the middle section to prevent wicking of the fusible elements along the contacts between first and second ends.

4. An electrical connector contact strip adapted for insertion into an electrical connector housing to form an electrical connector, the contact strip comprising:

a plurality of electrical contacts fixedly connected to each other in a row, each contact having a main section and a tab section extending from an end of the main section; and fusible elements mounted on the tab sections such that the fusible elements are aligned in a row, wherein the contact strip with the electrical contacts and fusible elements is adapted to be inserted into the electrical connector housing after the fusible elements are attached to the contacts to form the electrical connector with the electrical connector housing and, after the contacts are inserted into the electrical connector housing, the fusible elements are adapted to be at least partially located outside of the electrical connector housing aligned in a row.

5. A contact strip as in claim 4 wherein each tab section has an outward flared shape.

6. An electrical connector comprising:

a contact strip as in claim 4; and an overmolded body comprising dielectric material molded onto the contacts, wherein the contacts are connected to each other in series, wherein the body forms a seal between the tab sections and the main sections to prevent wicking of the fusible elements along the contacts between tab sections and second end sections of the contacts.

7. A contact strip as in claim 4 further comprising a body made of polymer material and connecting the electrical contacts to one another, wherein the tab sections extend from a first side of the body and a second end section of the contacts extend from an opposite second side of the body.

8. A contact strip as in claim 7 wherein the second sections comprise male contact tab sections.

9. A contact strip as in claim 7 wherein the second sections comprise deflectable contact sections.

10. An electrical connector contact strip adapted for insertion into an electrical connector housing to form an electrical connector, the contact strip comprising:

a plurality of electrical contacts connected to each other in series, the contacts each comprising a first end, a second end, and a middle section therebetween; and fusible elements connected to the second ends of the contacts, wherein the fusible elements comprise solder balls with the second ends of the contacts extending into the solder balls to thereby attach the solder balls with the second ends, wherein the electrical connector contact strip provides the contacts as a series of connected fusible element mountable electrical contacts in a strip, and wherein the contacts are sized and shaped to be inserted into the electrical connector housing with the fusible elements attached, and with the middle sections being fixedly mounted to the electrical connector housing, and with the fusible elements being located outside of the electrical connector housing and aligned in a row.

11. An electrical connector contact strip as in claim 10 further comprising an overmolded body connecting the contacts to each other, the overmolded body comprising main sections surrounding portions of the contacts and interconnect sections connecting the main sections to each other in series, wherein the body forms a seal at the middle sections of the contacts between the first and second ends to prevent wicking of the fusible elements along the contacts between first and second ends of the contacts.

12. An electrical connector contact strip as in claim 10 wherein the first ends each comprise a dual beam contact section.

13. An electrical connector contact strip as in claim 10 wherein the contacts comprise stamped sheet metal.

14. An electrical connector contact strip as in claim 13 wherein the second ends each form a tab section which has an outwardly flared shape.

15. An electrical connector contact strip as in claim 14 wherein the tab section comprises a general flat dovetail shape.

16. An electrical connector contact strip as in claim 14 wherein the contacts comprise a flat shape.

17. A method of assembling an electrical connector contact strip comprising steps of:

providing a plurality of electrical contacts connected in series, each contact comprising a first end, a second end and a middle section therebetween, wherein the contacts are comprised of stamped sheet metal; and attaching solder balls to the second ends of the contacts, the second ends of the contacts extending into the solder balls to thereby attach the solder balls with the second ends, wherein the contacts and solder balls are provided as a series of connected, stamped sheet metal, fusible element mountable electrical contacts in a strip which is adapted to be subsequently connected to a housing to form an electrical connector.

18. A method as in claim 17 wherein the contacts are stamped from the sheet metal to form the contacts with a substantially flat shape.

19. A method as in claim 17 wherein the contacts are stamped from the sheet metal to form the contacts with dual contact beams at their first ends.

20. A method of assembling an electrical connector comprising steps of:

assembling an electrical connector contact strip as in claim 17;

inserting the contacts, with the solder balls attached to the contacts, into an electrical connector housing with the solder balls being located at least partially outside of the housing and aligned in a row, wherein the adder balls are attached to the contacts before the contacts are inserted into the electrical connector housing.

* * * * *

UNITED STATES PATENT AND TRADEMARK OFFICE
CERTIFICATE OF CORRECTION

PATENT NO. : 6,712,626 B2
DATED : March 30, 2004
INVENTOR(S) : Harper, Jr. et al.

It is certified that error appears in the above-identified patent and that said Letters Patent is hereby corrected as shown below:

Column 6,
Line 40, after "into an" delete "the".
Line 41, after "attached" delete "to".
Line 42, after "inserted into" delete "an".
Line 43, after "elements" delete "are" (first occurrence).
Line 46, after "pocket" delete "area" and replace with -- areas --.
Lines 47 and 61, after "the tab" delete "section" and replace with -- sections --.
Line 62, after "fusible" delete "element" and replace with -- elements --.

Column 7,
Line 36, after "has an" delete "outward" and replace with -- outwardly --.

Column 8,
Line 59, after "wherein the" delete "adder" and replace with -- solder --.

Signed and Sealed this

Twenty-fifth Day of May, 2004

JON W. DUDAS
*Acting Director of the United States Patent and Trademark Office*